US012623500B2

(12) United States Patent
Arakelian et al.

(10) Patent No.: US 12,623,500 B2
(45) Date of Patent: May 12, 2026

(54) TRAILER CONNECTOR

(71) Applicant: Ark Corporation Pty Ltd, Arndell Park (AU)

(72) Inventors: Richard Arakelian, Arndell Park (AU); Shojaeddin Mirfendereski, Arndell Park (AU); Hsuan-chi Kuo, Arndell Park (AU)

(73) Assignee: Ark Corporation Pty Ltd, Arndell Park (AU)

( * ) Notice: Subject to any disclaimer, the term of this patent is extended or adjusted under 35 U.S.C. 154(b) by 284 days.

(21) Appl. No.: 18/492,497

(22) Filed: Oct. 23, 2023

(65) Prior Publication Data

US 2024/0051362 A1 Feb. 15, 2024

Related U.S. Application Data

(62) Division of application No. 16/586,289, filed on Sep. 27, 2019, now Pat. No. 11,794,539.

(30) Foreign Application Priority Data

Mar. 20, 2019 (AU) ................................. 2019900940
Apr. 5, 2019 (AU) ................................. 2019901186

(51) Int. Cl.
*B60D 1/64* (2006.01)
*B60Q 1/30* (2006.01)
(Continued)

(52) U.S. Cl.
CPC .............. *B60D 1/64* (2013.01); *B60Q 1/305* (2013.01); *B60Q 11/005* (2013.01); *G01R 31/006* (2013.01); *G07C 5/0808* (2013.01)

(58) Field of Classification Search
CPC ........ B60D 1/64; B60Q 1/305; B60Q 11/005; G01R 31/006; G07C 5/0808
See application file for complete search history.

(56) References Cited

U.S. PATENT DOCUMENTS 8,061,879 B2 * 11/2011 Simmons ............. B60Q 1/0023
362/546
9,501,877 B2 11/2016 Andrus
(Continued)

FOREIGN PATENT DOCUMENTS

AU 2010224443 B1 2/2011
DE 102012020033 A1 4/2014
WO 2012040774 A1 4/2012

*Primary Examiner* — Zheng Song
(74) *Attorney, Agent, or Firm* — The Belles Group, P.C.

(57) ABSTRACT

There is provided a vehicle mounted device (1) for connecting the electrical circuit of a towing vehicle to the electrical circuit of a towed vehicle. The device includes a body (2), a towed-side connector, and a towing side connector (3). The device is configured to receive input signals corresponding to the lights of the towing vehicle and to transmit these signals to the electrical circuits of the towed vehicle. The device includes a protection component to isolate the towing vehicle electrical system. The device may be configured to perform a testing protocol. The testing protocol can include a safety protocol that determines whether a towed vehicle is electrically connected to the device. The testing protocol may also test the functionality of the electrical circuits for the towing and towed vehicles.

16 Claims, 12 Drawing Sheets

(51) Int. Cl.
B60Q 11/00 (2006.01)
G01R 31/00 (2006.01)
G07C 5/08 (2006.01)

(56) References Cited

U.S. PATENT DOCUMENTS

| 10,663,508 B1 | 5/2020 | Walker | |
| 2002/0125771 A1* | 9/2002 | Kaminski | ................ B60D 1/62 |
| | | | 307/10.1 |
| 2014/0253307 A1 | 9/2014 | Miller et al. | |
| 2016/0167630 A1 | 6/2016 | Wolf | |
| 2018/0345803 A1 | 12/2018 | Nook et al. | |
| 2020/0298757 A1* | 9/2020 | Thompson | ........... G07C 5/0808 |
| 2024/0151761 A1* | 5/2024 | Bautch | ................. G01R 31/006 |

* cited by examiner

FIG. 2
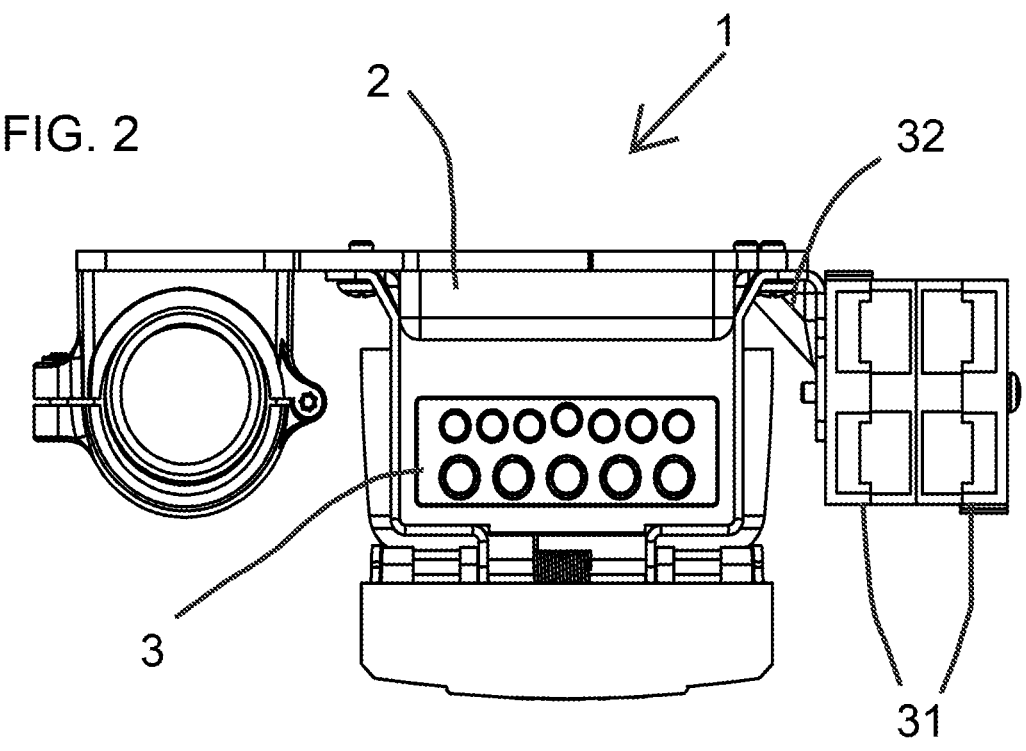
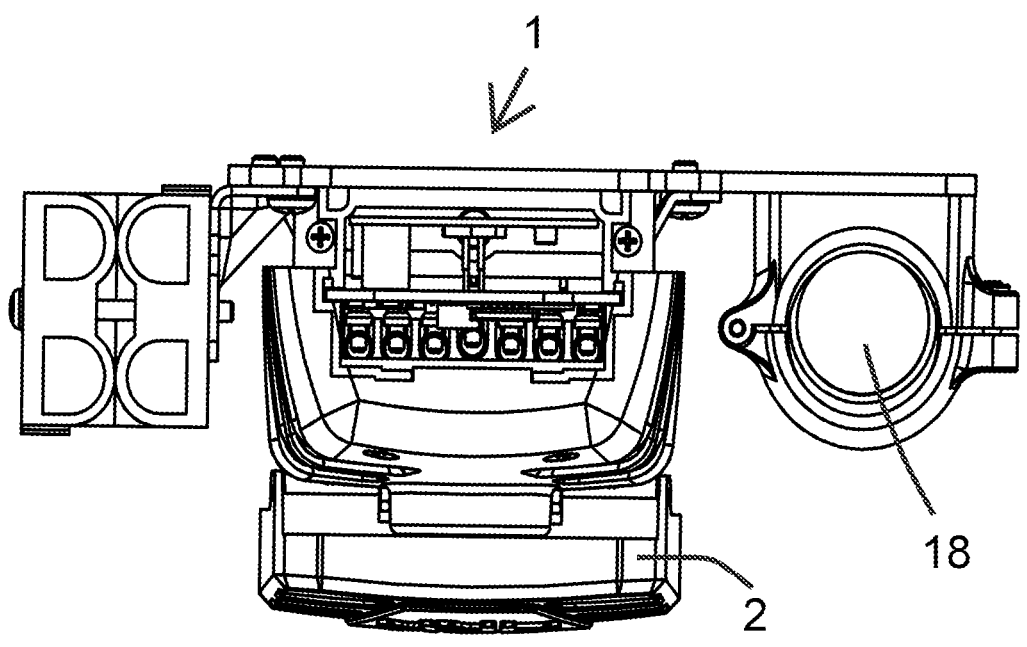
FIG.3

16

TRAILER CONNECTOR

CROSS-REFERENCE TO RELATED PATENT APPLICATIONS

The present application is a division of U.S. patent application Ser. No. 16/586,289, filed on Sep. 27, 2019, that claims priority to Australian Patent Application No. 2019900940, filed Mar. 20, 2019, and Australian Patent Application No. 2019901186, filed Apr. 5, 2019. The disclosures of all the aforementioned patent applications are incorporated herein by reference in their respective entireties, for all purposes.

TECHNICAL FIELD

The present invention relates to devices for electrically connecting to a towed vehicle. The invention has been developed primarily as a towing vehicle mounted connector for a towed vehicle and will be described hereinafter with reference to this application. However, it will be appreciated that the invention is not limited to this particular field of use.

BACKGROUND

The following discussion of the prior art is intended to place the invention in an appropriate technical context and enable the associated advantages to be fully understood. However, any discussion of the prior art throughout the specification should not be considered as an admission that such art is widely known or forms part of the common general knowledge in the field.

When towing a vehicle, the towing-vehicle driver is responsible to ensure that the lights of the trailer are illuminating simultaneously with the corresponding lights of the towing vehicle. These lights would usually include left and right turn indicators, brake lights, tail lights, and reverse lights. The trailer lights are powered and controlled by the towing vehicle through an electrical connector.

There exist trailer connectors or adaptors including LED lights that provide an indication of whether the cable connection between a tow vehicle and trailer is functional. Such devices necessarily require two people to use: a driver to operate the vehicle controls, such as the turn indicators and brakes; with an observer to check the status of the lights on the adaptor. In addition, these devices are unable to test the functionality of the trailer wiring or lights and cannot provide an indication of the location of any fault that occurs.

Another existing device utilises a battery-powered switch box which is connected via a cable to a stationary trailer. Each trailer light is switched on via the switch box and its operation checked manually. One such device is represented in Australian Patent number 2010224443 which describes a hand-held light test device for testing trailer lights. In use, the battery-powered device is connected to the electric circuit of the trailer lights and the lights to be tested are selected by, for example, rotating a knob on the test device which activates the relevant light circuit. The selected lights are illuminated using current provided by the battery of the device if both the selected lights and the corresponding electric circuit are functional. This device also includes a selectable setting for testing the circuits of the lights of a towing vehicle in a similar manner. Advantageously, the operation of the lights can be visually inspected by a single person while holding and operating the test device. This device does not require the trailer to be connected to a vehicle for testing. However, such devices are relatively expensive, and require the batteries to be replaced at frequent intervals. Also, the device must be disconnected from the trailer when the trailer is being towed. Accordingly, if there is a possibility that the lights of a trailer will be tested at an alternative location, the device must necessarily be transported to that location in the tow vehicle.

U.S. Pat. No. 9,501,877 describes an intelligent towing plug system for performing trailer electrical system testing, diagnostic, and monitoring routines, and towing vehicle wiring testing. The system utilises wireless technology housed inside a towing adaptor plug or an attached towing plug compartment housing to interface with a smart phone or computer system on-board the towing vehicle. The intelligent towing plug applies power to the circuit of each trailer light and measures the current flowing through the circuit to detect a fault automatically. The user is not able to select when testing occurs, rather testing is always on. The plug is not isolated from the tow vehicle electrical system, resulting in a risk of damage to the vehicle. This is a relatively high cost system.

It is an object of the present invention in at least a preferred embodiment to overcome or ameliorate at least one of the disadvantages of the prior art, or to provide a useful alternative.

SUMMARY OF THE INVENTION

According to a first aspect of the invention, there is provided a device for testing an electrical circuit of a towed vehicle; the device including:

a body;

an electrical circuit arrangement located within the body, the electrical circuit arrangement configured to receive power from a power source; and a towed-side connector configured to operably connect the electrical circuit arrangement to the electrical circuit of the towed vehicle;

wherein the electrical circuit arrangement includes:

a processor;

a communication module located within the body, the module in electrical communication with the processor; and a memory that stores instructions that, when executed by the processor, are configured to perform a testing protocol.

In some embodiments, the device is configured to be held by a user during operation. Preferably, the power source is a battery located within the body. Alternatively, the power source is external to the device, such as an external battery or mains electrical. In these embodiments, the device may be used to test the functionality of a trailer signal system when the trailer is not connected to a towing vehicle.

In other embodiments, the device preferably includes a towing-side connector configured to operably connect the processor to the electrical circuit of the towing vehicle. In these embodiments, the power source is the battery of the towing vehicle.

According to a second aspect of the invention, there is provided a device for connecting an electrical circuit of a towing vehicle to an electrical circuit of a towed vehicle, the device including:

a body;

an electrical circuit arrangement located within the body, the electrical circuit arrangement configured to receive power from a power source;

a towed-side connector configured to operably connect the electrical circuit arrangement to the electrical circuit of the towed vehicle;

a towing-side connector configured to operably connect the electrical circuit arrangement to the electrical circuit of the towing vehicle, wherein the electrical circuit arrangement includes:

a processor;

a communication module located within the body, the module in electrical communication with the processor; and a memory that stores instructions that, when executed by the processor, are configured to perform a testing protocol.

Preferably, the communication module is a wireless module. The wireless module preferably allows the device to interface with a smart phone or computer system. The wireless module is preferably a mobile chipset using a standard mobile network. The wireless module is preferably a Bluetooth module.

The electrical circuit arrangement is preferably substantially encased in silicon. This advantageously protects the electrical circuit arrangement against shocks, vibration and water ingress. The electrical circuit arrangement is preferably in the form of a printed circuit board.

The electrical circuit arrangement is preferably configured to receive input signals corresponding to lights of the towing vehicle. Preferably, the power source is a battery of the towing vehicle. The electrical circuit arrangement is preferably configured to prevent power provided to the towed vehicle flowing back to the power source. In one embodiment this is achieved via a protection component located between the power source and the towed vehicle. Advantageously, the electrical circuit arrangement is configured to operate lights of the towed vehicle.

In some embodiments, the device is mountable to a towing vehicle. Alternatively, the device is mountable to the towed vehicle.

The device preferably includes a light source. The light source is preferably configured to illuminate when a user turns on the daylight lights of the vehicle. Preferably, a predetermined light display occurs when the plug is connected successfully to a smart phone or computer system via the communication module. For example, the light source may flash twice when the plug is connected.

The device preferably includes a distance sensor. The distance sensor is preferably an ultrasonic sensor. Preferably, the sensor is hingedly mounted to the body. The hinged mount advantageously allows the sensor to be rotated for calibration of the sensor. The hinged mount can be locked following calibration so that the sensor remains in a fixed orientation during use. The distance sensor is preferably utilised to provide profile information for a specific towed vehicle.

The device preferably includes a speaker for providing an audible warning signal.

The device preferably includes at least one high current connector for providing power to a high current device. Preferably, the high current connector is an Anderson plug. The high current connector is preferably mounted to the body of the device by a mounting bracket. The connector is preferably electrically connected to the towing vehicle battery for allowing charge from the battery to be provided directly to the connected high current device.

Preferably, the testing protocol includes a safety protocol. The safety protocol preferably continuously monitors whether the towed vehicle is electrically connected to the towing vehicle. This advantageously allows a warning to be provided to the user if the towed vehicle is not electrically connected and therefore the lights of the towed vehicle are not functional. In one embodiment, the device includes an audible or visual indicator to provide an audible or visual alert to the user. In still further embodiments the alert is transmitted to a smart phone or vehicle on-board computer and displayed for the users' attention. This transmission may be wired or wireless, for example via Bluetooth.

The safety protocol includes the steps of: a) determining if the vehicle is in motion, b) determining whether a towed vehicle is electrically connected; c) sensing an object behind the tow vehicle based on a predefined profile; and d) communicating a warning if the towed vehicle is not electrically connected.

Preferably, step a) and/or b) are completed continuously. Preferably, step a) and/or step b) occur in real time.

Step a) preferably includes determining if the vehicle is moving. It may also include identifying and filtering out feedback associated with opening doors, closing doors, or people getting into or out of the vehicle.

Step b) may preferably include using a reed switch, or similar, to determine whether a cover for the towing-side connector is open or closed. Where the cover is closed, the towed-side connector cannot be connected to the towing vehicle. Step b) may alternatively include analysing a signal at the towed-side connector to determine if the connector is electrically connected to the towing vehicle. This signal may include, for example, current, voltage, voltage drop.

Preferably, step c) includes storing profile information for a specific towed vehicle and comparing sensed information with stored information. Advantageously, the invention is able to distinguish between a towed vehicle and a vehicle following close behind.

In one embodiment, the predefined profile is a calibrated based profile. The calibration based profile may be based on a measure of distance of a towed vehicle when it is connected to the towing vehicle. Alternatively, the profile may utilise a RFID tag or other identification component. The profile is advantageously used to distinguish the vehicle being towed from nearby motor and towed vehicles.

Preferably, step d) includes an audible warning that the user will hear from inside the towing vehicle. Alternatively step d) includes communicating a warning via the communication module to an external computing device. In still further embodiments, the communication module may be connected to the towing vehicle and the warning communicated through the internal vehicle display.

Preferably, the testing protocol includes a towed vehicle testing protocol for testing the functionality of the electrical circuit of the towed vehicle. The towed vehicle testing protocol preferably includes the following steps: a) selecting a light of the towed vehicle; b) sending a signal to a circuit corresponding to the selected light. The signal may include, for example, voltage, voltage drop, or current.

In one embodiment, the user selects the light to be tested using an application in a smart phone or other smart device. Preferably, the application provides a visual representation of the towed vehicle lights to allow user selection of a light to be tested. In this embodiment, following step b), the protocol may include step c) wherein the user observes whether the light illuminates.

Alternatively, the protocol may include a step c') wherein any feedback resulting from sending the signal to the circuit is analysed to determine whether the light is operational. Following step c'), the protocol may include step d) communicating the result of step c') using the communication module to an external computing device. In this alternative embodiment, the device may be configured to repeat the testing protocol for each light of the trailer without requiring user intervention. That is, all of the lights of the towed vehicle may be tested in turn following a single user command to initiate the testing protocol or without requiring any user commands.

Preferably, if a light of the towed vehicle has been left on after the test process has been completed the device can be configured to turn it off after a set time. Preferably, the device can be configured to automatically turn all lights off if wireless communication with the smart phone or device is lost.

The testing protocol may also include a towing vehicle testing protocol for testing the functionality of the towing vehicle connector electrical circuit and associated wiring with or without the towed vehicle connected.

The towing vehicle testing protocol preferably includes the following steps: a) operating a selected light of the towing vehicle with the vehicle controls; b) detecting if a signal from the towing vehicle corresponding to the operated light is present at the connector; and c) communicating the result of step (b) via the communication module to an external computing device. Preferably, the system monitors functionality of the light signals to the connector in real time. Advantageously, the device can be used to identify that a fault has occurred and additionally, whether the fault is at the towing vehicle or towed vehicle.

In a preferred embodiment, prior to step a) the towing vehicle testing protocol includes step of determining an initial condition of each of the towing vehicle light signals. This is preferably achieved by sensing a signal for each light at the towing side connector. The signal may be selected from voltage, voltage drop, or current.

Preferably, step b) includes monitoring the condition of each of the towing vehicle light signals and detecting if a change of condition occurs. This step is preferably conducted substantially simultaneously with step a).

Step c) preferably includes presenting a visual representation of the towing vehicle connector on an application installed on a smart phone or computer, including providing a visual indicator of any changes of condition that are detected in step b).

Preferably, at least one or both of the towed vehicle testing protocol and the towing vehicle testing protocol can be initiated by a user. Alternatively, one or both of the testing protocols may be initiated without requiring user input. Upon initiation of either of the vehicle testing protocols, the instructions are configured to terminate the safety protocol. Upon completing the initiated vehicle testing protocol, the instructions are configured to resume the safety protocol and to transmit, vie the communication module, a result of the completed vehicle testing protocol to an external computing device.

BRIEF DESCRIPTION OF THE DRAWINGS

A preferred embodiment of the invention will now be described, by way of example only, with reference to the accompanying drawings in which:

FIG. 2 is a front view of the connector shown in FIG. 1;

FIG. 3 is a rear view of the connector shown in FIG. 1;

PREFERRED EMBODIMENTS OF THE INVENTION

Referring to the accompanying drawings, there is provided a vehicle mounted device (1) for connecting the electrical circuit of a towing vehicle (not shown) to the electrical circuit of a towed vehicle (not shown). As shown in FIGS. 1 to 8, the device includes a body (2) a towed-side connector (not shown) and a towing side connector (3). As shown, the connectors may be in the form of a 12-pin flat socket or plug, as are common in the Australian market. Another common option are 7-pin round connectors. Alternatively, the plug and socket may be in any other form, such as a round type or having a different number of pins.

Figure 6:
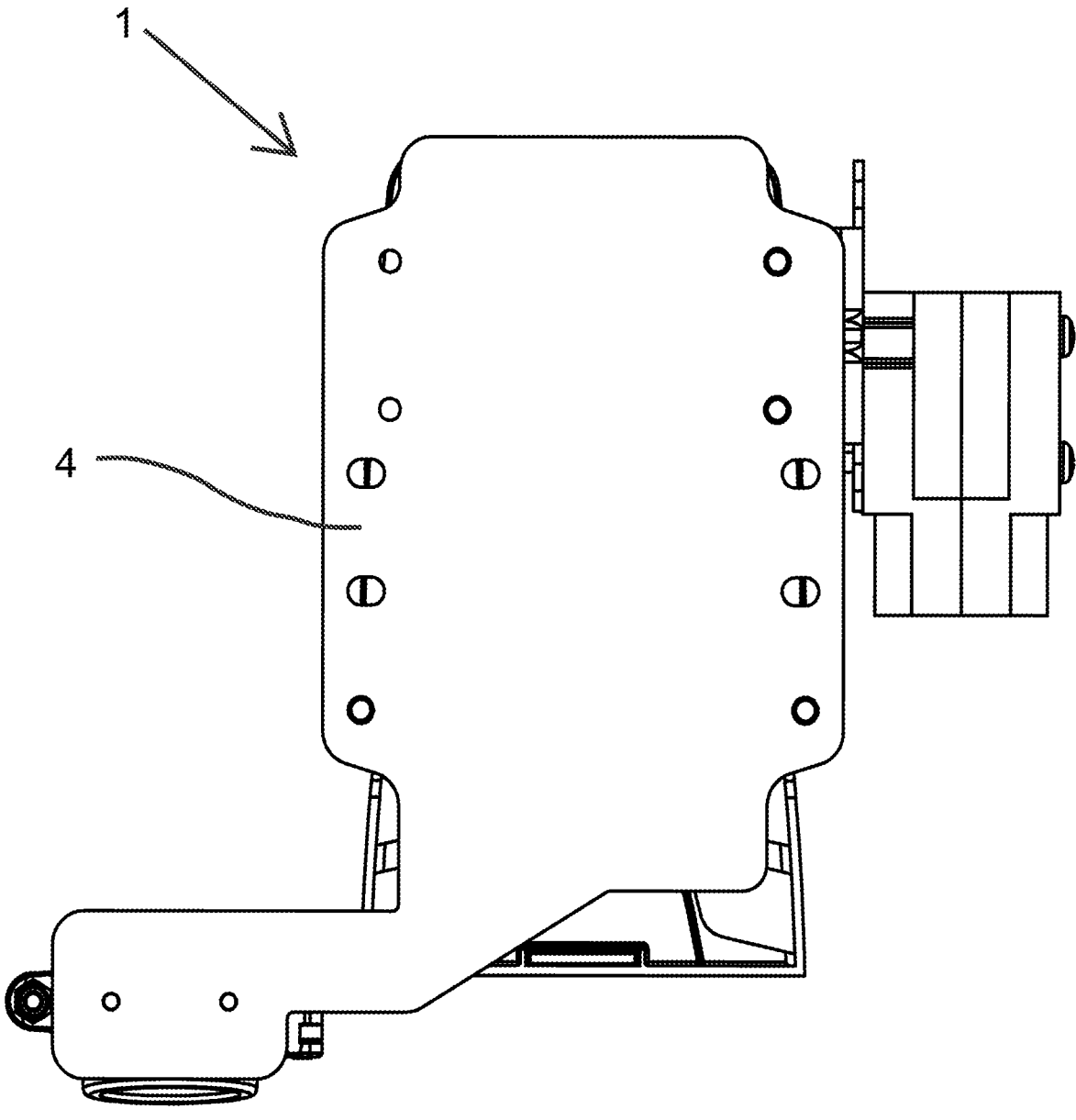
FIG. 6 is a top view of the connector shown in FIG. 1.
Figures 7, 8:
FIG. 7 is a sectional view taken along line T-T of FIG. 1.
FIG. 8 is a sectional view taken along line U-U of FIG. 1.

In the embodiment shown, the connector is installed on the towing vehicle, using mounting plate (4) shown in FIG. 6. However, it will be appreciated that in some embodiments (not shown) the device may not include a towing side connector. In these embodiments, the device is configured to be held by a user during operation. The power source may be a battery located within the body, an external battery, or mains electrical. In these embodiments, the testing protocol may be used to test the functionality of a trailer signal system when the trailer is not connected to a towing vehicle.

Figure 9:
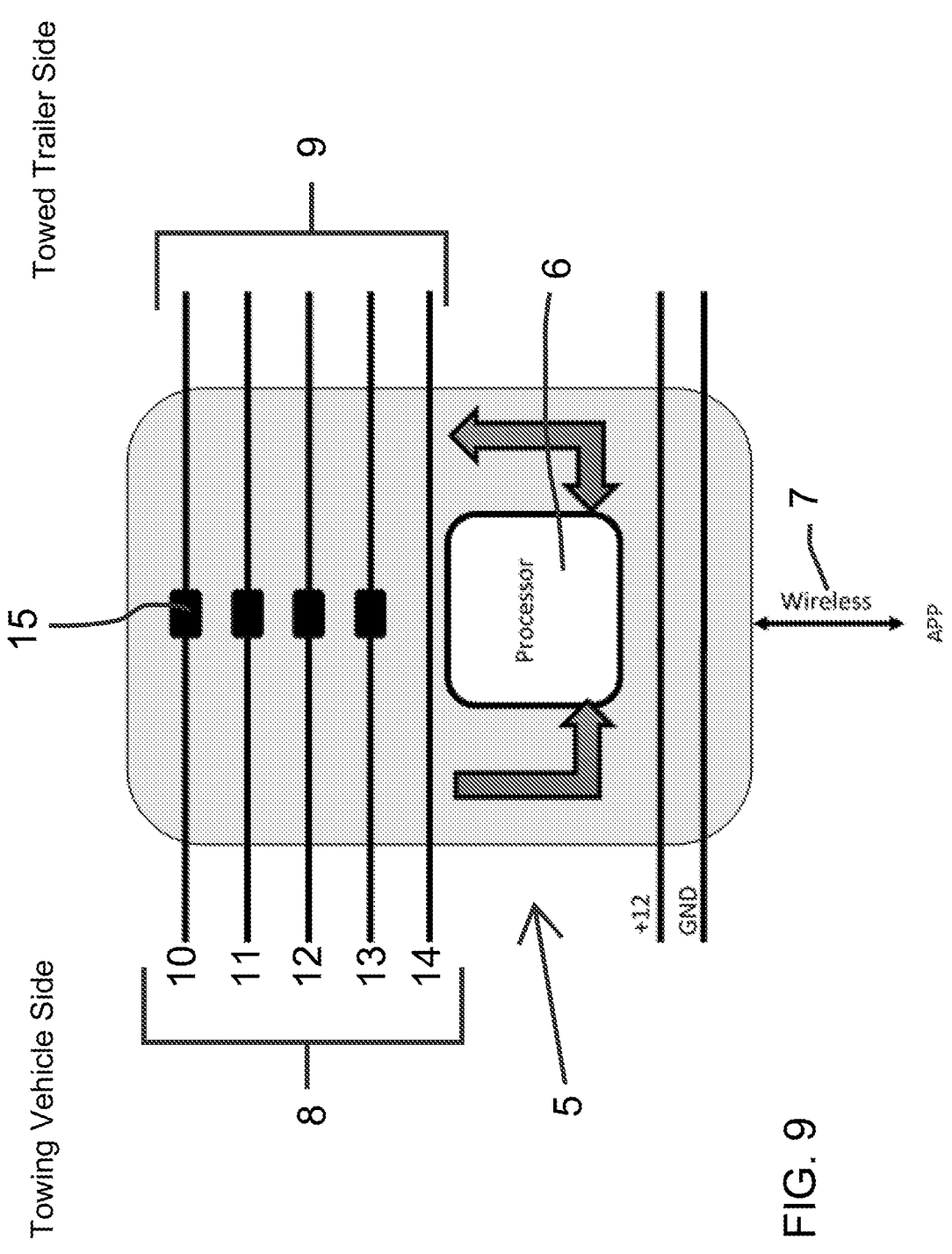
FIG. 9 is a schematic view of an electrical circuit arrangement of the connector of FIG. 1.

The device also includes an electrical circuit arrangement, preferably a printed circuit board (PCB), represented by 5 in FIG. 9. The PCB is encased in a layer of silicone to advantageously protect the PCB against shocks, vibration and water ingress that may occur when driving. The towed side connector and towing side connector each operably connect the electrical circuit arrangement to the electrical circuits of the towed vehicle and the towing vehicle respectively. In an alternative embodiment (not shown), the device may include a PCB external to the connector, perhaps in the form of an adaptor to go between vehicle socket and trailer plug.

The PCB is configured to receive power from a power source. The power is transmitted by the PCB to the electrical circuit of the towed vehicle, thereby to provide power to the lights of the towed vehicle. In the illustrated embodiment, the power source is the battery of the towing vehicle. As shown in FIG. 9, the electrical circuit arrangement includes a processor (6), a communication module in the form of a wireless module (7), and a memory (not shown) that stores instructions that, when executed by the processor, are configured to perform a testing protocol. In the illustrated embodiment, the wireless module allows the device to interface with an application on a smart phone or other smart device.

As shown in FIG. 9, the PCB is configured to receive input signals (8) corresponding to the lights of the towing vehicle. The PCB operates to transmit the signal (9) to the electrical circuit of the towed vehicle. The input signals may include, for example, left turn signal (10), right turn signal (11), brake signal (12), daylight signal (13), and E-brake signal (14).

As shown, a protection component (15), such as a diode or transistor, is included to isolate the towing vehicle electrical system and in operation this component prevents power flowing back to the power source and causing damage.

Figure 1:
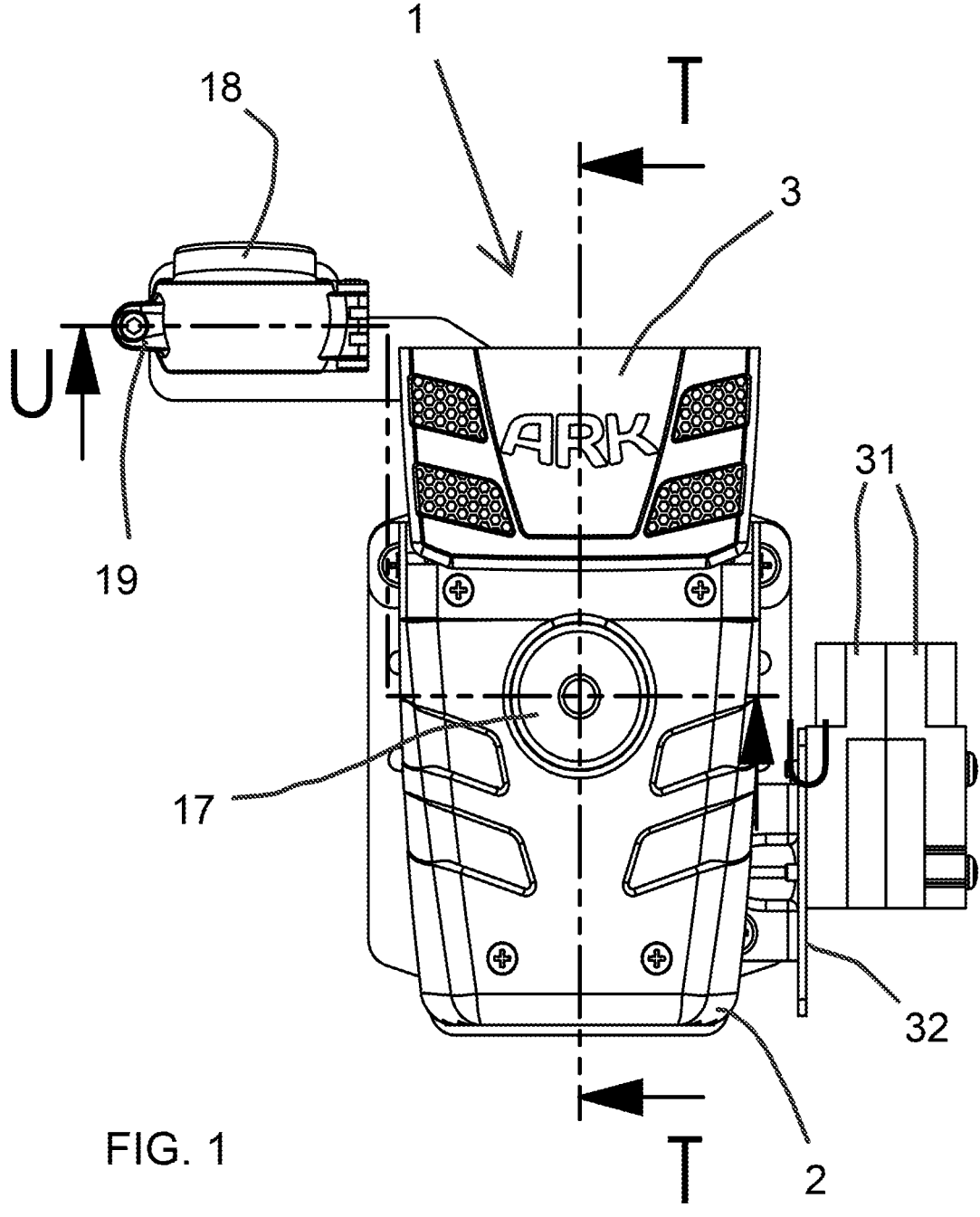
FIG. 1 is an underside view of the connector according to a preferred embodiment of the invention.
Figure 4:
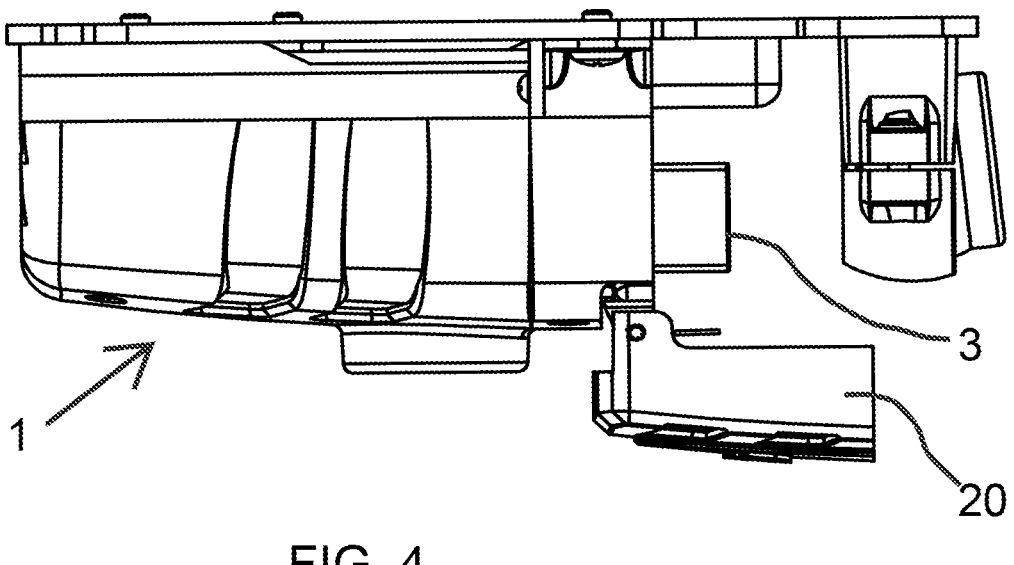
FIG. 4 is a left side view of the connector shown in FIG. 1.
Figure 5:
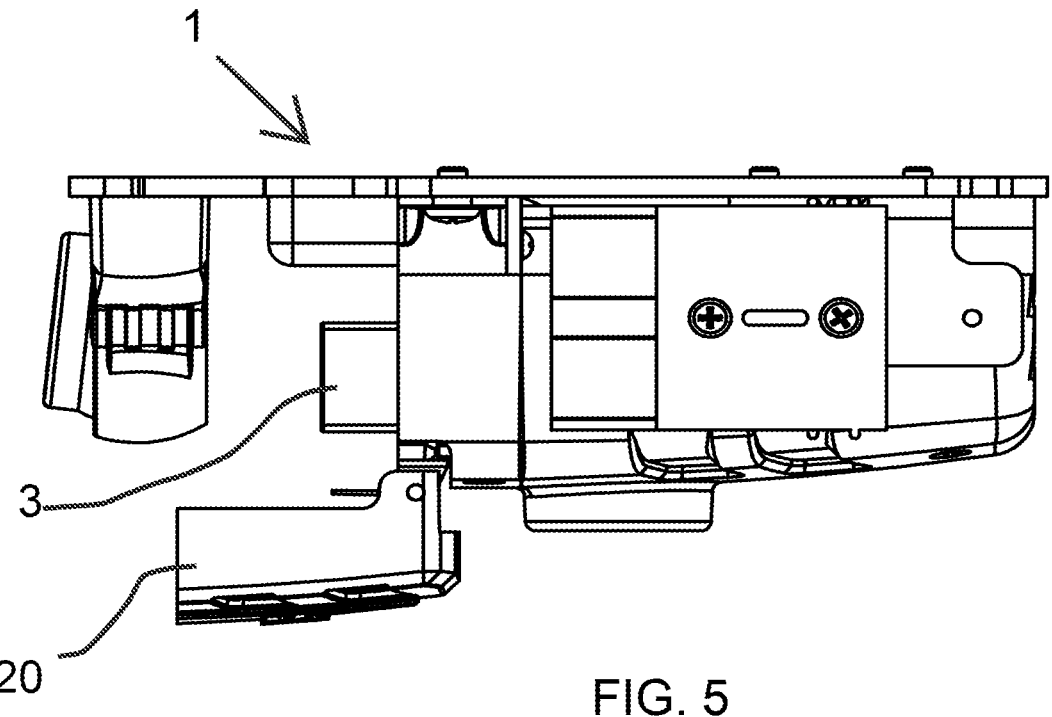
FIG. 5 is a right side view of the connector shown in FIG. 1.

As best shown in FIG. 2, the device includes a light (16) which is operable by the user, for example, by opening the application on the smart phone or turning on the vehicle lights using the application. The light provides illumination when connecting the vehicle and trailer connectors at night. The light can also be used to indicate successful connection, for example, flashing twice when the device is successfully connected to the trailer. Referring to FIG. 1, the device also includes a speaker (17) for providing an audible warning signal.

The device also includes a sensor, shown here as an ultrasonic distance sensor (18). The distance sensor may also be a laser sensor, infrared sensor, Lidar or radar. In the embodiment shown, the ultrasonic sensor is mounted in a ball joint (19) and can be rotated during set up of a trailer profile to ensure a consistent measurement is obtained. The mount can then be locked into position to ensure that the sensor does not move during driving.

In addition to the standard format trailer connector, the device includes at least one high current connector to externally mount high current devices, such as the auxiliary battery charger in a connected caravan. Referring to FIGS. 1 and 2, the embodiment shown includes two Anderson type plugs (31) mounted back-to-back and oriented perpendicular to the ground when the device (1) is installed. Alternatively, the plugs could be mounted parallel to the ground and in a piggy back style. The Anderson plugs are mounted to the device body (2) by mounting bracket (32). In the embodiment shown, the Anderson plugs (31) are mounted on the opposite side of the device (1) to the distance sensor (18). In other embodiments (not shown), the plugs may be mounted on the same side as the sensor, or in another suitable location. Each plug may include a rubber cover (not shown) which covers the front of the connector to prevent dust or water ingress.

Each Anderson plug is electrically connected to the towing vehicle battery and allows charge from this battery to flow directly to the connected high current device. The plug may be waterproof. Any size or colour of Anderson plug may be used, or any suitable alternative high current connector may also be used. Advantageously, providing different colour or style plugs on a single device (1) makes it easier for the user to connect different accessories to the corresponding plug.

Figure 10:
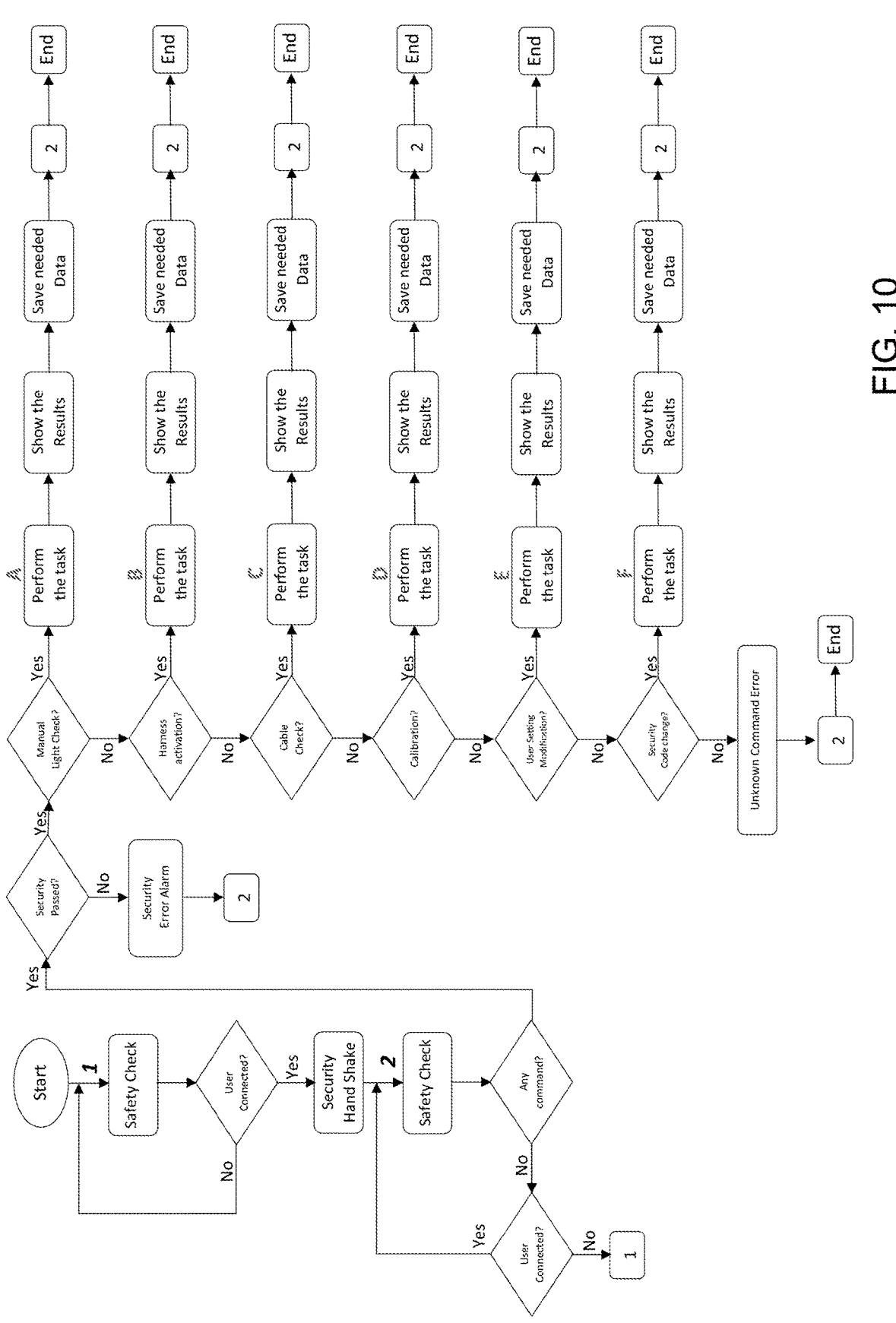
FIG. 10 is a flow chart showing the operation of a smart device application according to a preferred embodiment of the invention.
Figure 11:
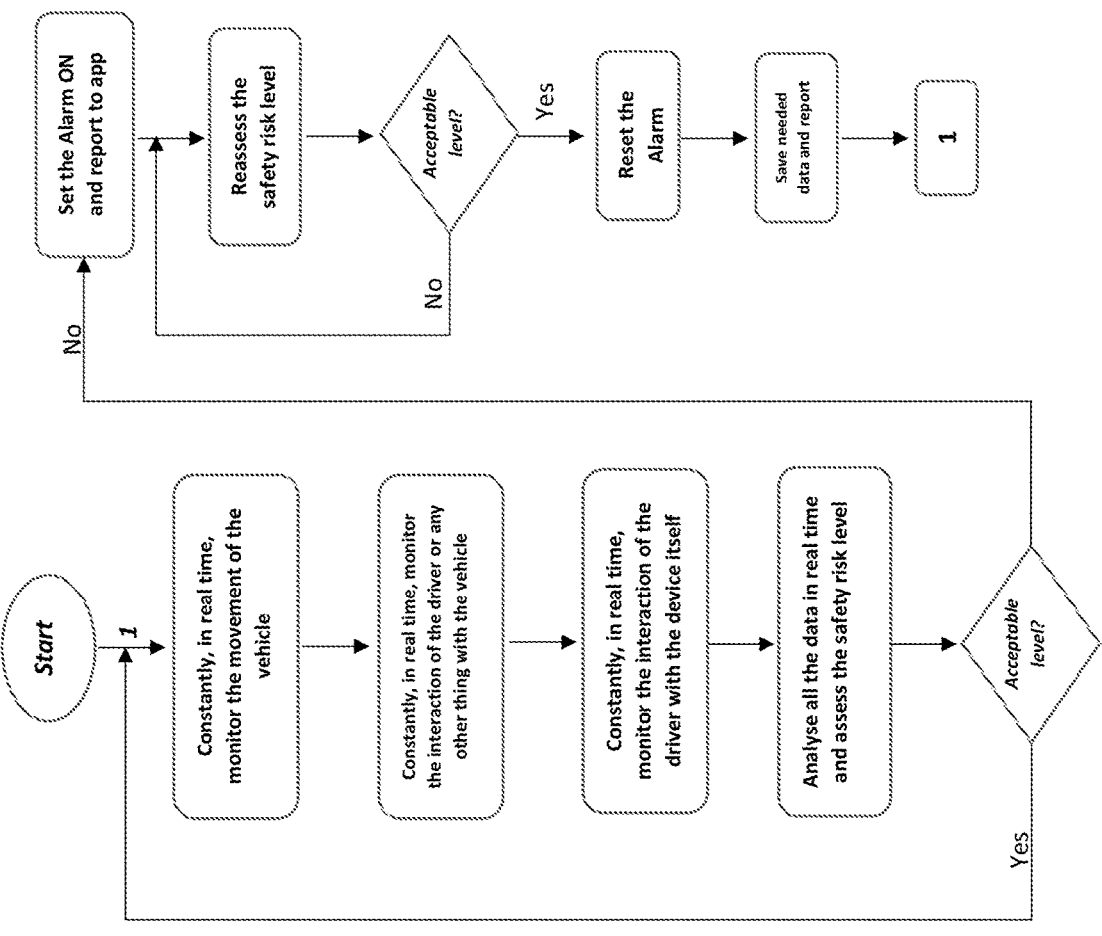
FIG. 11 is a flow chart showing the steps included in a safety protocol.
Figure 12:
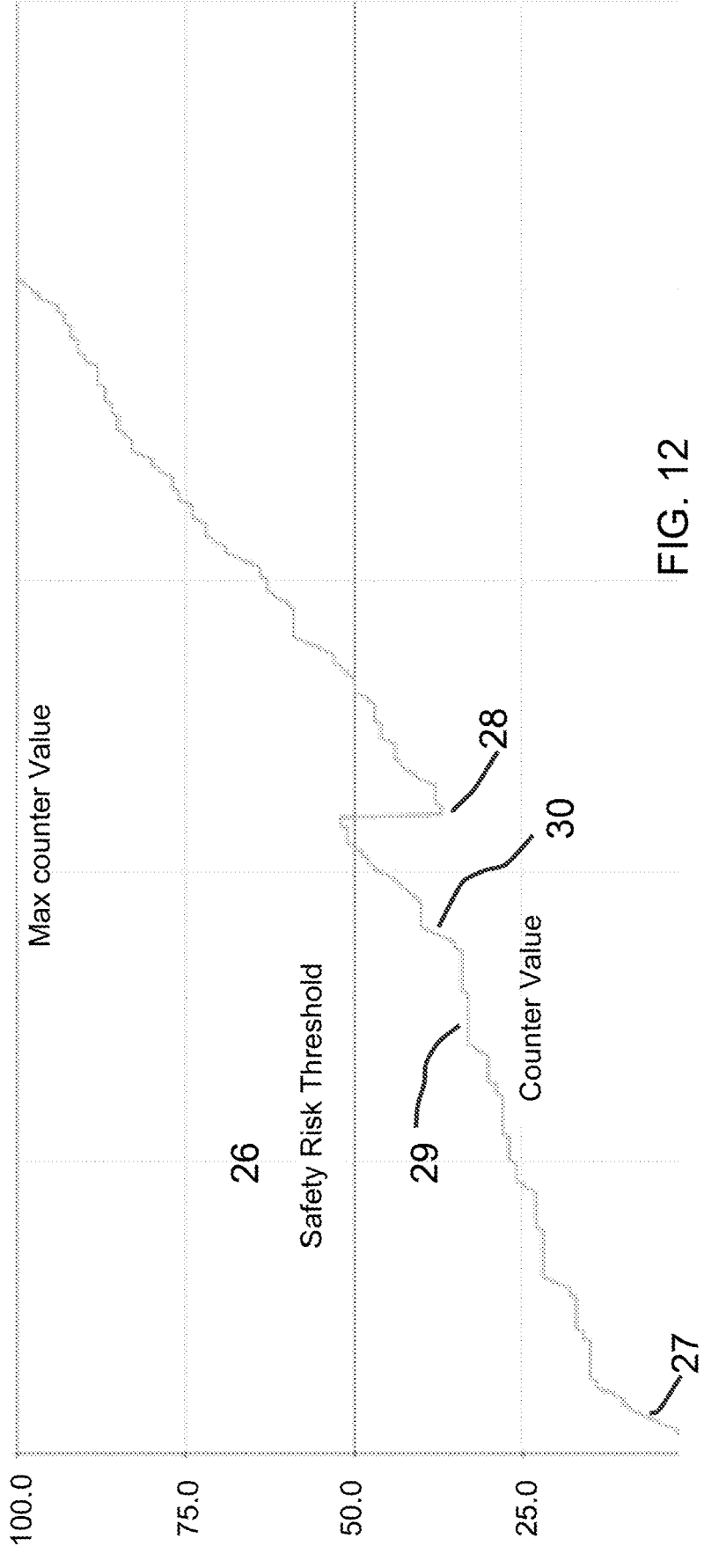
FIG. 12 is a graph showing the counter value and safety risk threshold.

In use, as shown in FIGS. 10 to 12, the device will operate a safety protocol which continuously monitors whether the towed vehicle is electrically connected to the towing vehicle. This electrical connection is required when driving to meet road regulations. Once the application is initiated by the user, the safety protocol will be initiated. The safety protocol involves continuously monitoring the movement of the vehicle to determine whether the vehicle is in motion. It ignores and filters out inappropriate feedback of opening and closing the doors or jumping into the vehicle. The rearward facing distance sensor and established trailer profile are used to determine whether a towed vehicle is physically and electrically connected to the towing vehicle. For the electrical connection, a reed switch or other suitable sensor on the towing vehicle connector cover (20) is used to determine if the cover is up or down (that is, whether the towed vehicle connector is plugged in).

To confirm the physical presence of a trailer, an established trailer profile is compared with real time measurements of any vehicle (towed or otherwise) following behind the towing vehicle. Where more than one trailer profile is saved, the user can select the expected trailer profile using the smart phone application. Advantageously, by comparison with the saved trailer profile, the invention is able to distinguish between a towed vehicle and a vehicle following close behind. Other methods may also be used to detect the presence of a trailer being towed. These may include a load sensor on the tow ball, sensing change in the rear ride height of the towing vehicle, and RFID tag on the trailer, or image processing using a camera.

Figure 13:
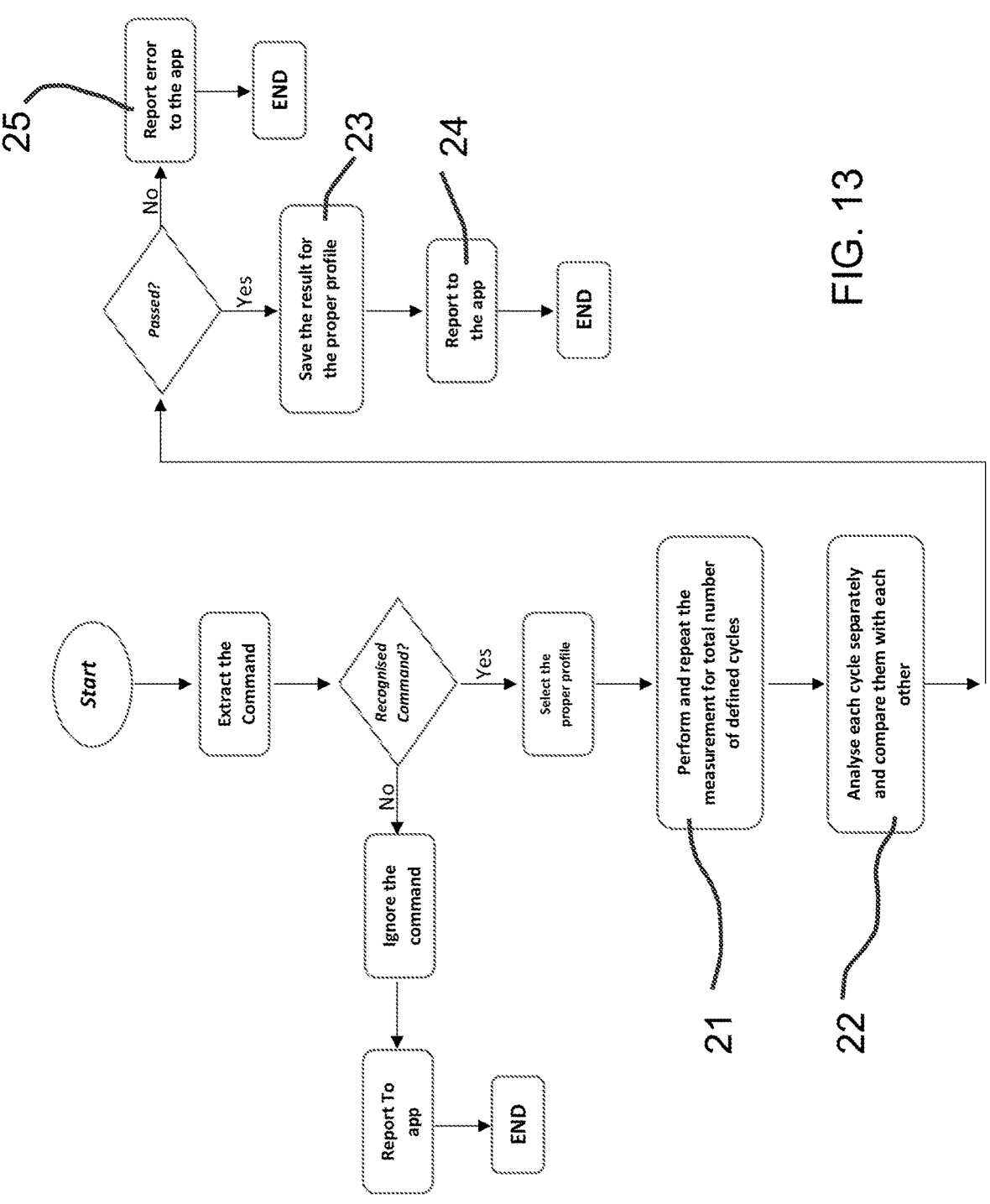
FIG. 13 is a flow chart showing the steps included in setting up a trailer profile.

As shown in FIG. 13, to set up a trailer profile, the user connects a trailer to the towing vehicle and initiates a calibration command through an application on the smart device. The application is used to select an available trailer profile to be populated with data. The ultrasonic sensor is used to measure the location of the connected trailer. This measurement is repeated for a selected number of cycles (21). Each measurement cycle is analysed separately and the cycles compared for consistency of measurement (22). It may be necessary to adjust the position of the ultrasonic sensor to obtain more consistent measurements and sonar audio guidance can also be available in the device to assist the user to adjust the position of the ultrasonic sensor. If the measurements taken are consistent, the results are saved to the selected towed vehicle profile (23) and a report is provided via the smart device application to the user (24). If there is an error, this is also reported to the user via the application (25). In preferred embodiments of the device, more than one unique trailer profile is able to be saved.

If the vehicle is in motion, with a trailer physically but not electrically connected, a warning is communicated to the user. A safety risk level can also be incorporated so that the warning notification occurs only when a specific safety risk level is also achieved. The safety risk algorithm determines the actual movement of the car on the road by feedback from the motion sensor, filtering out error noise and checking for turn and braking signals. This warning may be an audible sound emitted from a speaker (17) on the device or alternatively a message communicated wirelessly to the application on the smart phone or other smart device. This advantageously allows a warning to be provided to the user if the towed vehicle is not electrically connected and therefore the lights of the towed vehicle are not functional.

Referring to FIG. 12, the safety risk algorithm may include a counter which is compared with a predefined safety risk threshold (26). If movement of the vehicle is detected, the counter is increased (27). Where no movement occurs during a predefined interval, the counter can be decreased (28). If the vehicle is not moving but interaction with the car is identified, such as turning the lights on or off or pressing the brake, the decrease to the counter is paused (29). When the vehicle starts to move, the counter is increased again (30).

Movement of the vehicle may be detected using any suitable sensor. This sensor may include a vibration sensor, an accelerometer, an air pressure sensor, an air speed sensor, a temperature sensor, or a sensor on the vehicle axle.

At set time intervals, the device analyses the value of the counter and compares it with the predefined safety risk threshold (26). Under the conditions set out below, the safety protocol is performed. Once the safety protocol has been performed, the results are reported to the user.

If the counter value has risen from zero and is more than the safety risk threshold, (that is, the counter value has crossed the safety threshold in the upward direction) and there is at least one sign of interaction from the user (turning on signals or brake) the user has started driving the car. The device is configured to proceed through the steps of the safety protocol.

If the counter starts decreasing from above the safety risk threshold and reaches zero and there is no interaction from the user (that is, not touching lights or brakes) for a defined period of time, the car has stopped from moving. The device is configured to proceed through the steps of the safety protocol. The safety protocol won't be performed when a vehicle is stopped at a traffic light, for example, because the brakes of the vehicle will be activated.

If the counter has stayed between zero and the safety risk threshold, it is assumed that any counter value changes are due to noise, such as opening or closing the vehicle doors. In this case, the vehicle hasn't moved and there is no need to proceed through the steps of the safety protocol.

Figure 14:
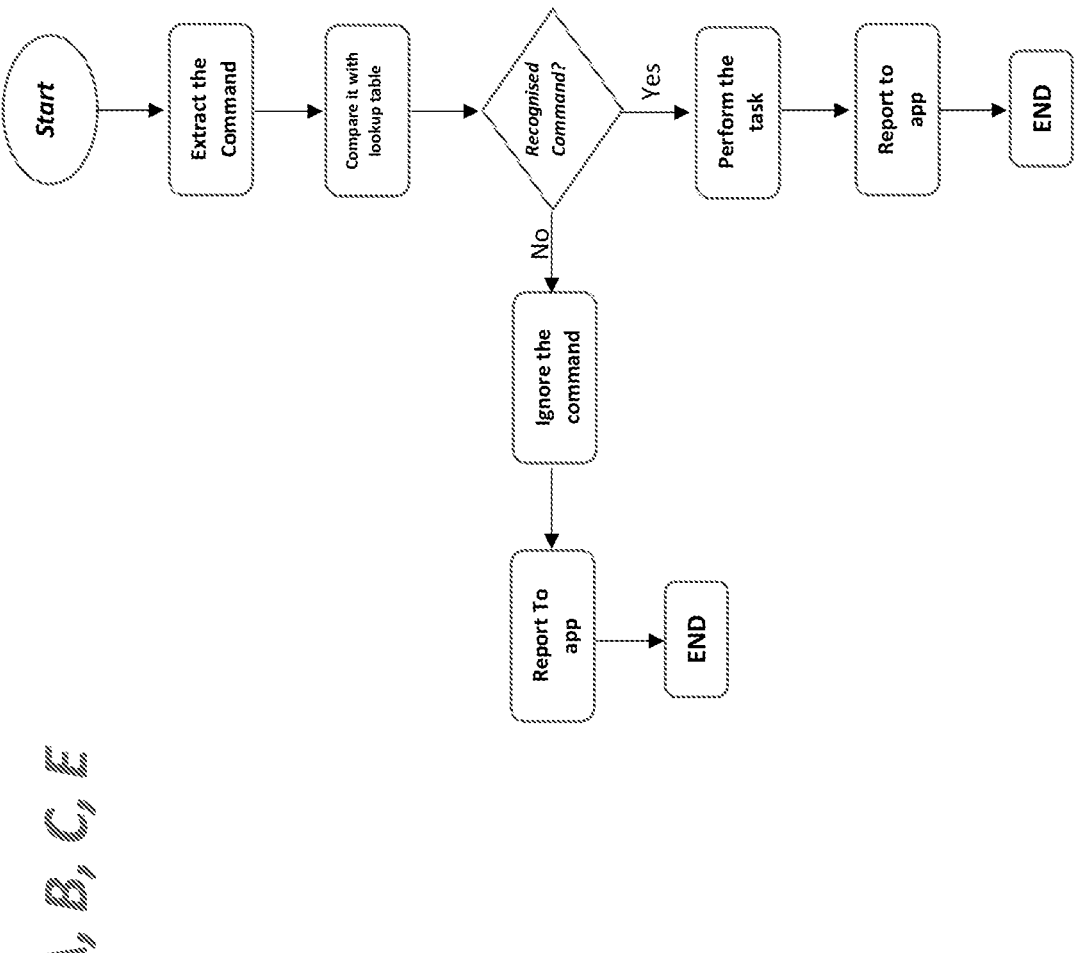
FIG. 14 is a flow chart showing the steps included in checking lights, harness activation, checking cables, and modification of user settings.

As shown in FIGS. 10 and 14, the user may also select a light of the towed vehicle to test. This testing protocol includes selecting a light of the vehicle via the application and sending a signal to the selected light. In a preferred embodiment of the invention, the user selects the light to be tested using an application in a smart phone or other smart device. For ease of use, the application may provide a visual representation of the towed vehicle lights to allow user selection of a light to be tested. The user may observe the relevant light of the trailer to confirm whether the light illuminates.

Alternatively, feedback resulting from sending the signal to the circuit may be analysed to determine whether the selected light is operational. This result may be communicated to the application or another external device. In this alternative, the towed vehicle testing protocol may be initiated by user selection in the application and the device configured to repeat the testing protocol for each light of the trailer without requiring any addition user intervention.

Advantageously, if a light of the towed vehicle has been left on after the test process has been completed the device can be configured to turn it off after a set time.

The device may also be used to test the functionality of the towing vehicle connector electrical circuit and associated wiring with or without the towed vehicle connected.

The device is first used to determine an initial condition of each of the towing vehicle light signals. This is achieved by sensing a signal for each light at the towing side connector, where the signal may voltage, voltage drop, or current. The user is directed to operate each of the lights of the towing vehicle using the vehicle controls. Simultaneously, the device checks the status of each of the light signals at the towing side connector. If the status is unchanged from the initial condition, no information is sent. If the status has changed from the initial condition, the result is sent to the application which displays the change in status and shows whether the corresponding towing vehicle light signal at the connector is on or off. The user can observe this result and identify whether there is a fault in the signal that they are operating. Advantageously, the device can be used to identify faults in real time. This application will also be useful when installing the device onto the towing vehicle as the functionality of the signals from the towing vehicle can be confirmed during installation.

In addition, the device is able to detect whether the signal from the towing vehicle corresponding to the selected light was sent through the device and communicate this information to the application. The device can thus be used to identify that a fault has occurred and additionally, whether the fault is at the towing vehicle or towed vehicle. This is achieved by applying power to the circuit of the device and measuring the voltage signal to check the towing side cables and then manually activating a signal from the app and then visually checking the towed vehicle lights. This provides a low cost, reliable and compact solution. As shown in FIGS. 10 and 14, the user may use the smart device application to modify user settings. The user settings may be on the device side or the application side. They may include providing a default setting, such as turning harness on, or setting a home screen display which indicates the last time the lights were checked or provides a reminder to check the calibration profile.

FIGS. 10 and 14 also show how the harness function can be engaged or disengaged. In some circumstances, the light signal provided from the towing vehicle doesn't provide sufficient voltage to illuminate the lights of the towed vehicle to the required level. In these situations, the harness function can be engaged. Upon sensing a signal from the towing vehicle, the harness function is configured to turn on an electronic/electrical actuator so that additional power is provided to the towed vehicle lights directly from the towing vehicle battery. When the harness function is off, the towed vehicle will utilise whatever voltage is provided through the lights signal. The harness function may be selected by a user of the device, for example through the application.

Figure 15:
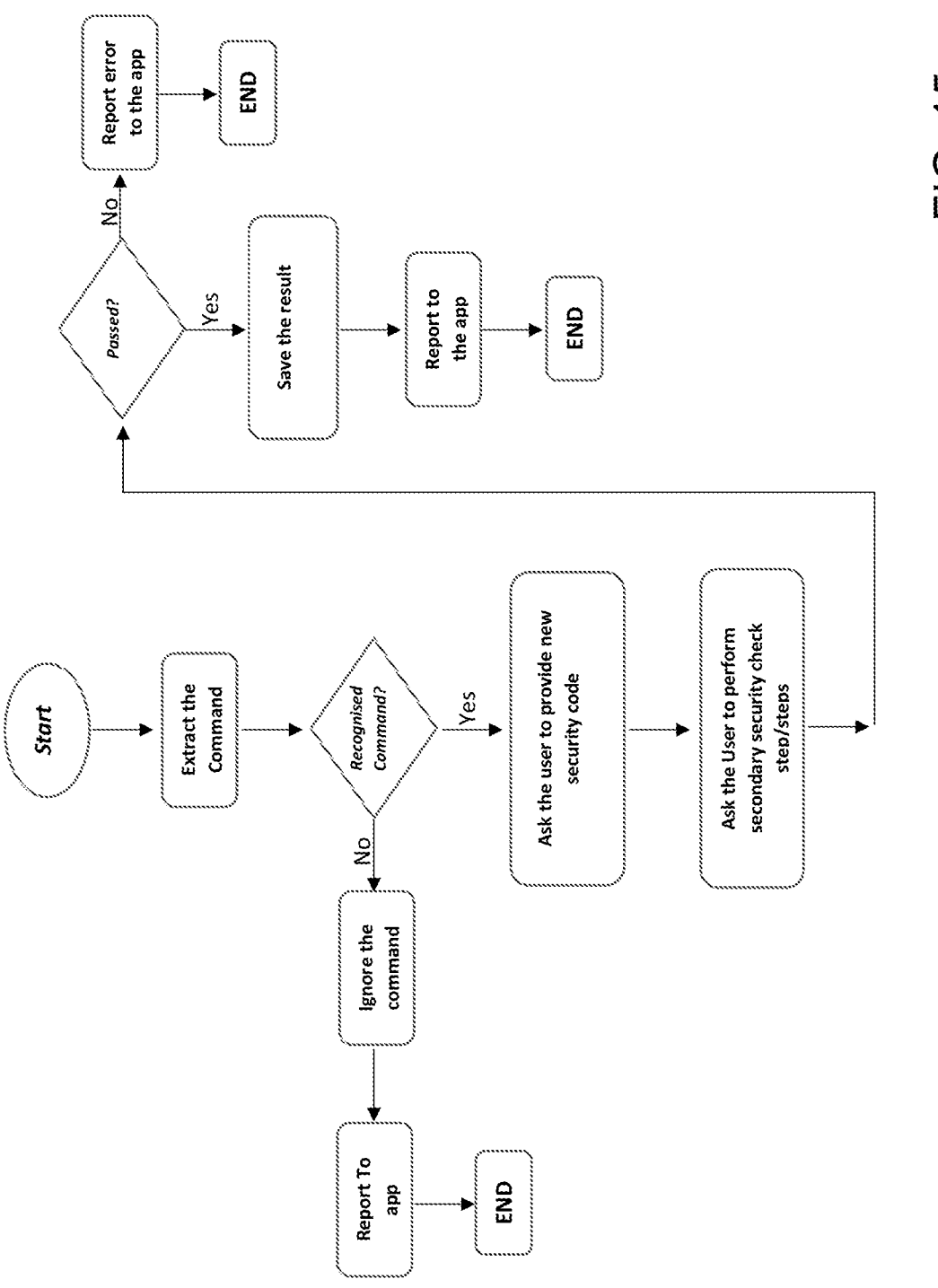
FIG. 15 is a flow chart showing the steps included in changing a security code.

The user may also set and change a security code, as shown in FIGS. 10 and 15. The use of a security code to access the application ensures that only authorised users for a particular connector device are able to test and operate the lights of a connected trailer. In addition, in the preferred embodiment of the invention, an additional level of authentication is required to change the security code. For example, the user may be instructed to enter the current code and to activate the brake and an indicator light of the towing vehicle, before the code can be changed. Both the application and the connected vehicle are used to provide additional security.

Advantageously, the invention reduces the total number of people required to check the trailer or caravan cabling and lighting system to one person. Previously one person would sit in the car to operate the controls while another would check to see that the trailer lights are activating when the brake pedal pressed etc. With the device and associated application, the user can manually switch all the trailer lights using the app when observing the trailer lights to see if they are working or not The system enables the user to check the cabling and lighting system of a caravan or trailer.

The system enables the user to check and diagnose problems of connector cables of the car itself in real time.

The invention advantageously overcomes the issue of voltage drop in case of long wiring by providing a power supply separate from the activation signal for LED vehicle lights The invention provides a safety reminder feature which alarms the user if he/she forgets to connect the trailer or caravan plug and starts driving with the trailer/caravan towed behind but there is no brake, stop, indicator etc lights operational. This is an important problem to solve since a serious accident can occur if the trailer lights are not operational during towing. The alarm can be a warning on the app or an audible sound from a buzzer on the smart socket Advantageously, all of the mentioned above features can be combined in one device which can be monitored and interact with wirelessly, with different smart devices such as mobile phone or tablet. This approach solves the issue of having multiple devices instead of one and obviates the need for long control wiring.

The invention uses an app for user interaction which is more informative and convenient for users.

The invention is battery free. It uses the power directly from car's battery instead of a small internal battery which solves the issue with battery life and the inconvenience of recharging The invention acts as both a monitoring and actuator device, while remaining isolated from the towing vehicle and towed vehicle. As a result, if something happens to the device functionality, it will not interfere with the standard functionality of the towing vehicle or towed vehicle lighting system. This addresses the requirement to have the lighting system working in all situations.

Although the invention has been described with reference to specific examples, it will be appreciated by those skilled in the art that the invention may be embodied in many other forms.

The invention claimed is:

1. A device for connecting an electrical circuit of a towing vehicle to an electrical circuit of a towed vehicle, the device including:
   a body;
   an electrical circuit arrangement located within the body, the electrical circuit arrangement configured to receive power from a power source;
   a towed-side connector configured to operably connect the electrical circuit arrangement to the electrical circuit of the towed vehicle;
   a towing-side connector configured to operably connect the electrical circuit arrangement to the electrical circuit of the towing vehicle,
   wherein the electrical circuit arrangement includes:
   a processor;
   a communication module located within the body, the communication module in electrical communication with the processor; and
   a memory that stores instructions that, when executed by the processor, are configured to perform a testing protocol,
   wherein the testing protocol includes a safety protocol which continuously monitors whether the towed vehicle is electrically connected to the towing vehicle, and
   wherein the safety protocol includes the steps of:
   a) determining if the vehicle is in motion;
   b) determining whether a towed vehicle is electrically connected;
   c) sensing an object behind the tow vehicle based on a calibrated profile; and
   d) communicating a warning if the towed vehicle is not electrically connected.

2. The device according to claim 1, wherein at least one of steps a) and b) occur continuously and/or in real time.

3. The device according to claim 1, wherein step a) includes identifying and filtering out feedback associated with opening doors, closing doors, or people getting into or out of the vehicle.

4. The device according to claim 1, wherein the communication module is a wireless module or the electrical circuit arrangement is at least partially encased in silicon.

5. The device according to claim 1, comprising at least one high current connector for providing power to a high current device.

6. The device according to claim 1, wherein the electrical circuit arrangement includes a protection component for preventing power flowing back to the power source from the electrical circuit of the towed vehicle.

7. The device according to claim 6, wherein the protection component is located between the power source and the towed vehicle.

8. The device according to claim 6, wherein the electrical circuit arrangement includes a printed circuit board (PCB) and the protection component is mounted to the PCB.

9. The device according to claim 1, comprising a distance sensor for measuring the location of the towed vehicle.

10. The device according to claim 9, wherein the distance sensor is hingedly mounted to the body.

11. A device for connecting an electrical circuit of a towing vehicle to an electrical circuit of a towed vehicle, the device including:
   a body;
   an electrical circuit arrangement located within the body, the electrical circuit arrangement configured to receive power from a power source;
   a towed-side connector configured to operably connect the electrical circuit arrangement to the electrical circuit of the towed vehicle;
   a towing-side connector configured to operably connect the electrical circuit arrangement to the electrical circuit of the towing vehicle,
   wherein the electrical circuit arrangement includes:
   a processor;
   a communication module located within the body, the communication module in electrical communication with the processor; and
   a memory that stores instructions that, when executed by the processor, are configured to perform a testing protocol,
   wherein the testing protocol includes a towed vehicle testing protocol for testing the functionality of the electrical circuit of the towed vehicle, and
   wherein the towed vehicle testing protocol includes the following steps:
   a) selecting a light of the towed vehicle; and
   b) sending a signal to a circuit corresponding to the selected light.

12. The device according to claim 11, wherein the towed vehicle testing protocol includes the following steps:
   c) a user observing whether the selected light illuminates or
   c) analyzing feedback resulting from step b) to determine whether the light is operational; and
   d) optionally communicating the result of step c) using the communication module to an external computing device.

13. A device for connecting an electrical circuit of a towing vehicle to an electrical circuit of a towed vehicle, the device including:

a body;

an electrical circuit arrangement located within the body, the electrical circuit arrangement configured to receive power from a power source;

a towed-side connector configured to operably connect the electrical circuit arrangement to the electrical circuit of the towed vehicle;

a towing-side connector configured to operably connect the electrical circuit arrangement to the electrical circuit of the towing vehicle, wherein the electrical circuit arrangement includes:

a processor;

a communication module located within the body, the communication module in electrical communication with the processor; and a memory that stores instructions that, when executed by the processor, are configured to perform a testing protocol, wherein the testing protocol includes a towing vehicle testing protocol for testing the functionality of the electrical circuit of the towing vehicle with or without the towed vehicle connected, and wherein the towing vehicle testing protocol includes the following steps:

a) operating a selected light of the towing vehicle with the vehicle controls;

b) detecting if a signal from the towing vehicle corresponding to the operated light is present; and c) optionally communicating the result of step b) via the communication module to an external computing device.

14. The device according to claim 13, wherein prior to step a), the towing vehicle testing protocol includes a step of determining an initial condition of each of the towing vehicle light signals.

15. The device according to claim 14, wherein step b) includes monitoring the condition of each of the towing vehicle light signals and detecting if a change of condition occurs, and step b) is preferably performed substantially simultaneously with step a).

16. The device according to claim 15 wherein step c) includes presenting a visual representation of the towing vehicle on an application installed on a smart phone or computer, including optionally providing a visual indicator of any changes of condition that are detected in step b).

\* \* \* \* \*